(12) United States Patent
Imada et al.

(10) Patent No.: US 8,846,297 B2
(45) Date of Patent: *Sep. 30, 2014

(54) POSITIVE PHOTORESIST COMPOSITION, COATING FILM THEREOF, AND NOVOLAC PHENOL RESIN

(75) Inventors: Tomoyuki Imada, Ichihara (JP); Takakazu Kage, Ichihara (JP); Norifumi Imaizumi, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/110,311

(22) PCT Filed: Apr. 10, 2012

(86) PCT No.: PCT/JP2012/059763
§ 371 (c)(1),
(2), (4) Date: Oct. 7, 2013

(87) PCT Pub. No.: WO2012/141165
PCT Pub. Date: Oct. 18, 2012

(65) Prior Publication Data
US 2014/0023969 A1 Jan. 23, 2014

(30) Foreign Application Priority Data

Apr. 12, 2011 (JP) ................ 2011-088163

(51) Int. Cl.
G03F 7/039 (2006.01)
C08G 8/08 (2006.01)
C08G 8/12 (2006.01)
C08L 61/06 (2006.01)
C08G 8/20 (2006.01)
C09D 161/06 (2006.01)
G03F 7/021 (2006.01)
G03F 7/023 (2006.01)

(52) U.S. Cl.
CPC .............. *G03F 7/039* (2013.01); *G03F 7/0233* (2013.01); *C08G 8/08* (2013.01); *C08G 8/12* (2013.01); *C08L 61/06* (2013.01); *C08L 2205/02* (2013.01); *C08G 8/20* (2013.01); *C09D 161/06* (2013.01)
USPC .......... 430/270.1; 430/192; 430/191

(58) Field of Classification Search
None
See application file for complete search history.

(56) References Cited

U.S. PATENT DOCUMENTS 5,456,995 A 10/1995 Ozaki et al.
8,623,585 B2 * 1/2014 Imada et al. ............ 430/270.1

FOREIGN PATENT DOCUMENTS

| JP | 02-055359 A | 2/1990 |
| JP | 02-275955 A | 11/1990 |
| JP | 06-348006 A | 12/1994 |
| JP | 09-073169 A | 3/1997 |

OTHER PUBLICATIONS

International Search Report dated May 22, 2012, issued for PCT/JP2012/059763.

* cited by examiner

*Primary Examiner* — Cynthia Hamilton
(74) *Attorney, Agent, or Firm* — Edwards Wildman Palmer LLP; James E. Armstrong, IV

(57) ABSTRACT

A positive photoresist composition includes 3 to 80 parts by mass of a novolac phenol resin (B) relative to 100 parts by mass of a cresol novolac resin (A). The novolac phenol resin (B) has a repeating structural unit represented by formula (1)

$$-[X-\underset{R}{CH}]- \quad (1)$$

[In the formula, R represents a hydrogen atom or a hydrocarbon group having 1 to 12 carbon atoms and X represents a structure (x1) represented by formula (2)

(2)

[structure showing triphenylmethane with HO— on left phenyl with $(R^1)_m$, OH on upper right phenyl with $(R^2)_{n'}$, and lower phenyl with $(OH)_t$ and $(R^3)_p$]

20 Claims, 4 Drawing Sheets

POSITIVE PHOTORESIST COMPOSITION, COATING FILM THEREOF, AND NOVOLAC PHENOL RESIN

TECHNICAL FIELD

The present invention relates to a positive photoresist composition having excellent developing properties and heat resistance, and a coating film made from the positive photoresist composition.

BACKGROUND ART

Positive photoresists that use alkali-soluble resins and sensitizers such as 1,2-naphthoquinone diazide compounds have been known to serve as resists for manufacturing semiconductors such as ICs and LSIs, display devices such as LCDs, and plates for printing. There has been proposed a positive photoresist composition that uses a mixture of an m-cresol novolac resin and a p-cresol novolac resin as the alkali-soluble resin (for example, refer to PTL 1).

The positive photoresist composition described in PTL 1 was developed to improve the developing properties, such as sensitivity. However, the recent increase in the degree of semiconductor integration has required ever higher sensitivity to form patterns with finer lines. The positive photoresist composition described in PTL 1 has a problem in that it does not have sensitivity sufficient for forming finer lines. Meanwhile, coating films made from positive photoresist compositions need to withstand heat since they are subjected to various heat treatments in the steps of manufacturing semiconductors and the like. However, the positive photoresist composition described in PTL 1 has another problem in that it does not have sufficient heat resistance.

There has also been proposed a positive photoresist composition from which a coating film having heat resistance and high resolution can be obtained. In this composition, a polyhydroxyl compound such as 2,3,4-trihydroxybenzophenone is used as a sensitivity enhancer and a novolac resin obtained by adding oxalic acid to a mixture of 2,3-xylenol, m-cresol, p-cresol, and dihydroxybenzaldehyde to allow reaction of 2,3-xylenol, m-cresol, p-cresol, and dihydroxybenzaldehyde to thereby obtain a condensate (random polymer) and allowing the condensate to react with formaldehyde is used as a main ingredient (for example, refer to PTL 2 and PTL 3). However, none of the positive photoresist compositions described in PTL 2 and PTL 3 sufficiently meets the high level of heat resistance required in recent years.

CITATION LIST

Patent Literature

PTL 1: Japanese Unexamined Patent Application Publication No. 2-55359
PTL 2: Japanese Unexamined Patent Application Publication No. 2-275955
PTL 3: Japanese Unexamined Patent Application Publication No. 9-073169

SUMMARY OF INVENTION

Technical Problem

An object of the present invention is to provide a positive photoresist which achieves both high sensitivity and high heat resistance and from which a coating film that has significantly high sensitivity and heat resistance is obtained, a coating film made from the composition, and a novolac phenol resin that is suitable for obtaining the composition.

Solution to Problem

The inventors of the present invention have conducted extensive studies and found the following. That is, a condensate having a homogeneous structure can be obtained by allowing the reaction between a phenolic hydroxyl group-containing aromatic compound and an aldehyde compound while making use of the difference in activation energy among the carbon atoms of the phenolic hydroxyl group-containing aromatic compound, and such a condensate cannot be obtained by not considering the activation energy as in the case of preparing the novolac resin serving as a main ingredient in PTL 3. A novolac resin obtained by reacting the condensate with an aldehyde compound has a repeating structural unit constituted by a structure derived from the condensate and a structure derived from the aldehyde compound. A coating film having significantly high sensitivity and heat resistance can be obtained by using the novolac resin having such a repeating unit as a sensitivity enhancer, not as the main ingredient as in PTL 3. Typically, a sensitivity enhancer such as one described in PTL 3 decreases the glass transition temperature of the composition for a resist and degrades the heat resistance of the coating film obtained; however, when the novolac resin having the aforementioned repeating unit is used as a sensitivity enhancer, the glass transition temperature is increased unlike when conventional sensitivity enhancers are used. Thus, a coating film with excellent heat resistance is obtained. The novolac resin that has the aforementioned repeating unit may contain other repeating units since a coating film having significantly high sensitivity and heat resistance can be obtained as long as a particular amount or more of the aforementioned repeating units are contained. Based on these findings, the present invention has been made.

In other words, the present invention provides a positive photoresist composition comprising 3 to 80 parts by mass of a novolac phenol resin (B) relative to 100 parts by mass of a cresol novolac resin (A), wherein the novolac phenol resin (B) has a repeating structural unit represented by formula (1) below:

[Chem. 1]

[In the formula, R represents a hydrogen atom or a hydrocarbon group having 1 to 12 carbon atoms and X represents a structure (x1) represented by formula (2) below:

[Chem. 2]

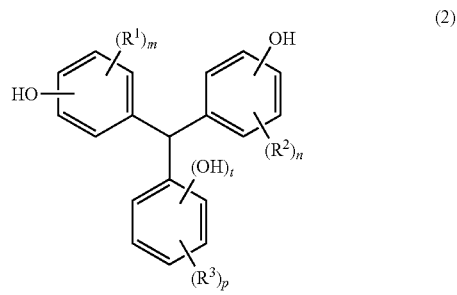

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)],
wherein a content of the structure (x1) relative to the total number of the structure (x1) and the structure (x2) is 85% or more.

The present invention also provides a coating film obtained by applying and drying the positive photoresist composition described above.

The present invention also provides a novolac phenol resin comprising a repeating structural unit represented by formula (1) below:

[Chem. 3]

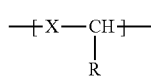

(1)

[In the formula, R represents a hydrogen atom or a hydrocarbon group having 1 to 12 carbon atoms and X represents a structure (x1) represented by formula (2) below:

[Chem. 4]

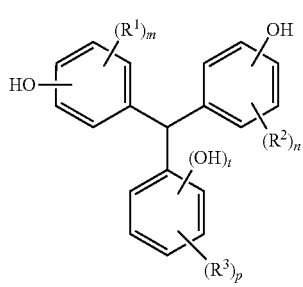

(2)

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)],
wherein a content of the structure (x1) relative to the total number of the structure (x1) and the structure (x2) is 85% or more, and the structural unit represented by formula (1) is a structural unit represented by formula (1-1) below:

[Chem. 5]

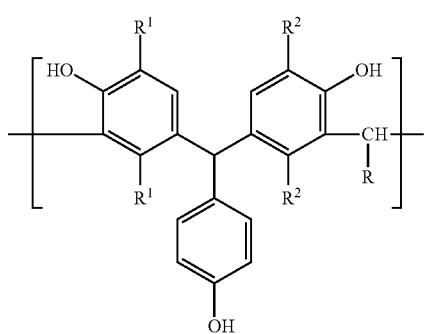

(1-1)

(In the formula, R represents a hydrogen atom or a hydrocarbon group having 1 to 12 carbon atoms and $R^1$ and $R^2$ each independently represent a hydrogen atom or an alkyl group having 1 to 8 carbon atoms.).

The present invention also provides a novolac phenol resin comprising a repeating structural unit represented by formula (1) below:

[Chem. 6]

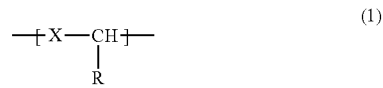

(1)

[In the formula, R represents a hydrogen atom or a hydrocarbon group having 1 to 12 carbon atoms and X represents a structure (x1) represented by formula (2) below:

[Chem. 7]

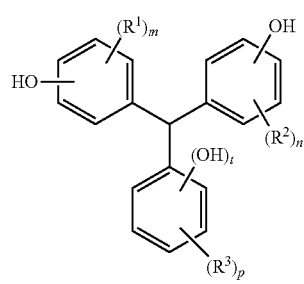

(2)

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)],
wherein a content of the structure (x1) relative to the total number of the structure (x1) and the structure (x2) is 85% or more, and the structural unit represented by formula (1) is a structural unit represented by formula (1-2) below:

[Chem. 8]

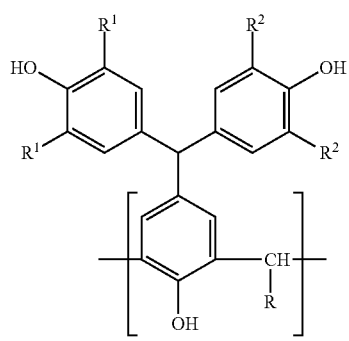

(1-2)

(In the formula, R represents a hydrogen atom or a hydrocarbon group having 1 to 12 carbon atoms and $R^1$ and $R^2$ each independently represent a hydrogen atom or an alkyl group having 1 to 8 carbon atoms.).

Advantageous Effects of Invention

A positive photoresist composition according to the present invention achieves both high sensitivity and high heat resistance, which have been difficult to achieve by the related art. Thus the composition is suitable for use as positive photoresists for manufacturing semiconductors such as ICs and LSIs, display devices such as LCDs, and plates for printing that involve formation of finer patterns.

DESCRIPTION OF EMBODIMENTS

Figure 1:
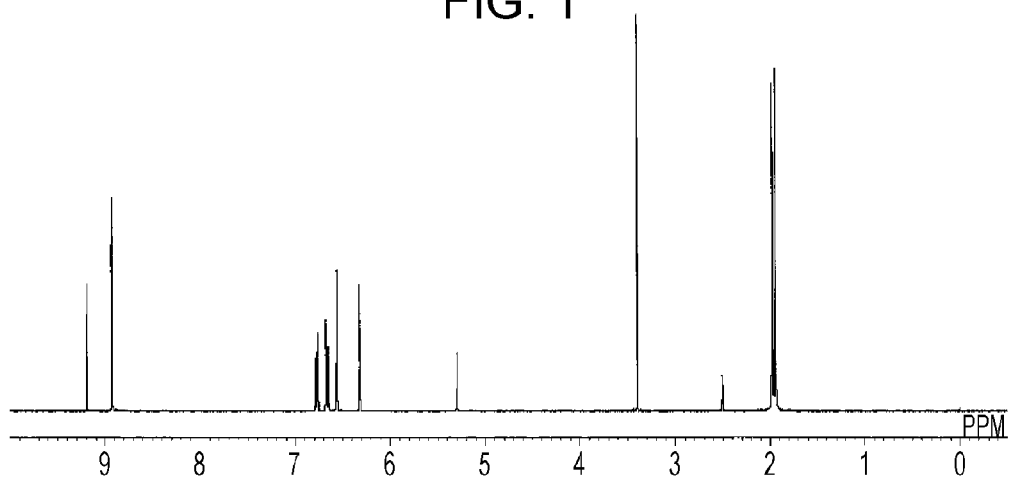
FIG. 1 is a $^1$H-NMR spectrum chart of a polycondensate (C1) obtained in Synthetic Example 2.

A positive photoresist composition of the present invention contains 3 to 80 parts by mass of a novolac phenol resin (B) relative to 100 parts by mass of a cresol novolac resin (A). When 3 to 80 parts by mass of the novolac phenol resin (B) is contained relative to 100 parts by mass of the cresol novolac resin (A), a positive photoresist composition from which a cured product (coating film) that has high sensitivity to alkalis and excellent heat resistance can be obtained. Preferably, 10 to 70 parts by mass and more preferably 20 to 60 parts by mass of the novolac phenol resin (B) is contained relative to 100 parts by mass of the cresol novolac resin (A) since a coating film having high sensitivity to alkalis and excellent heat resistance can be obtained.

An example of the cresol novolac resin (A) used in the present invention is a novolac phenol resin obtained by condensation of raw materials, for example, an aldehyde-based compound and a cresol-containing phenol-based compound.

The phenol-based compound contains cresol as an essential component. Phenols other than cresol and derivatives thereof may or may not be contained. Examples of the phenols other than cresol and the derivatives thereof include phenol; xylenols such as 2,3-xylenol, 2,4-xylenol, 2,5-xylenol, 2,6-xylenol, 3,4-xylenol, and 3,5-xylenol; ethyl phenols such as o-ethylphenol, m-ethylphenol, and p-ethylphenol; butyl phenols such as isopropylphenol, butylphenol, and p-t-butylphenol; alkyl phenols other than ethyl phenols and butyl phenols, such as p-pentylphenol, p-octylphenol, p-nonylphenol, and p-cumylphenol; halogenated phenols such as fluorophenol, chlorophenol, bromophenol, and iodophenol; mono-substituted phenols such as p-phenylphenol, aminophenol, nitrophenol, dinitrophenol, and trinitrophenol; fused polycyclic phenols such as 1-naphthol and 2-naphthol; and polyvalent phenols such as resorcin, alkyl resorcin, pyrogallol, catechol, alkyl catechol, hydroquinone, alkyl hydroquinone, phloroglucin, bisphenol A, bisphenol F, bisphenol S, and dihydroxynaphthalene. These other phenols and derivatives thereof may be used alone or in combination. When other phenols or derivatives are used in combination, the amount of the other phenols or derivatives used is preferably within the range of 0.05 to 1 mol per mole of cresol in total.

Examples of the aldehyde-based compound serving as a raw material of the cresol novolac resin (A) includes formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allyl aldehyde, benzaldehyde, crotonaldehyde, acrolein, tetraoxymethylene, phenylacetaldehyde, o-tolualdehyde, and salicylaldehyde. These aldehyde-based compounds can be used alone or in combination. Formaldehyde is preferably used as the raw material of the cresol novolac resin (A) and form aldehyde may be used in combination with another aldehyde-based compound. When formaldehyde is used in combination with another aldehyde-based compound, the amount of this other aldehyde-based compound used is preferably in the range of 0.05 to 1 mol per mole of formaldehyde.

Among the cresol novolac resins (A) prepared from raw materials, phenol-based compounds and aldehyde-based compounds, examples of which are described above, a cresol novolac resin obtained by condensation using m-cresol as a phenol-based compound and formaldehyde as the aldehyde-based compound as essential raw materials is preferable. Moreover, a cresol novolac resin obtained by condensation of m-cresol and p-cresol as the phenol-based compound and formaldehyde as the aldehyde-based compound as essential raw materials is more preferable. When m-cresol or m-cresol and p-cresol are used as the phenol-based compound serving as an essential raw material, the molar ratio of m-cresol to p-cresol (m-cresol/p-cresol] is preferably in the range of 100/0 to 20/80 and more preferably in the range of 70/30 to 20/80 since both sensitivity and heat resistance can be achieved.

In the case where m-cresol or m-cresol and p-cresol are used as essential raw materials as the phenol-based compound as described above, 2,5-xylenol may be added as the phenol-based compound in order to further improve the heat resistance. When 2,5-xylenol is used as a raw material, the amount thereof used in terms of a molar ratio to the total number of moles of m-cresol and p-cresol [cresol/2,5-xylenol] is preferably in the range of 99/1 to 50/50 and more preferably in the range of 95/5 to 70/30 since both sensitivity and heat resistance can be more smoothly achieved.

The condensation reaction of the phenol-based compound and the aldehyde-based compound is preferably carried out in the presence of an acid catalyst. Examples of the acid catalyst include oxalic acid, sulfuric acid, hydrochloric acid, phenol sulfonic acid, para-toluene sulfonic acid, zinc acetate, and manganese acetate. These acid catalysts may be used alone or in combination. Among these acid catalysts, oxalic acid is preferred since oxalic acid decomposes on heating and does not remain. The acid catalyst may be added before the reaction or during the reaction.

The molar ratio [(F)/(P)] of the phenol-based compound (P) to the aldehyde-based compound (F) during production of the cresol novolac resin (A) is preferably in the range of 0.3 to 1.6 and more preferably in the range of 0.5 to 1.3 since high sensitivity and heat resistance can be obtained.

A specific example of a method for producing the novolac phenol resin (A) is a method that includes heating a phenol-based compound, an aldehyde-based compound, and an acid catalyst to 60° C. to 140° C. to induce polycondensation reaction, and dehydrating and removing monomers from the resulting mixture under a reduced pressure condition.

The novolac phenol resin (B) used in the present invention has a repeating structural unit represented by formula (1) below

[Chem. 9]

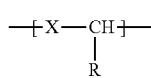
(1)

[In formula, R represents a hydrogen atom or a hydrocarbon group having 1 to 12 carbon atoms and X represents a structure (x1) represented by formula (2) below

[Chem. 10]

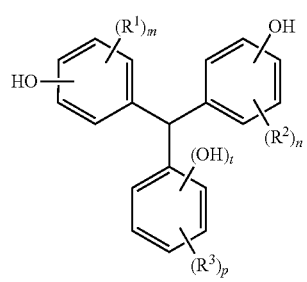
(2)

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)],
where the content of the structure (x1) relative the total number of the structure (x1) and the structure (x2) is 85% or more.

When there are more than one $R^1$, $R^1$ may be the same or different. The same applies to $R^2$ and $R^3$.

The content of the structure (x1) can be determined from the amounts of the phenol represented by (1), the aldehyde compound, and an optional phenol other than the phenol represented by (1) that are used. The content of the structure (x1) can also be calculated by $^{13}$C-NMR measurement. In particular, the content is measured and calculated by the following method.

<$^{13}$C-NMR Measurement Conditions>
Instrument: AL-400 produced by JEOL Ltd.
Measurement mode: SGNNE (NOE-suppressed 1H complete decoupling method)
Pulse angle: 45° C. pulse
Sample concentration: 30 wt %
Number of transients: 10000

The content of the structure (x1) is preferably 90% or higher, more preferably 94% or higher, and most preferably 98% or higher since a positive photoresist composition from which a coating film having excellent heat resistance and sensitivity is obtained is obtained. A novolac phenol resin in which all X in general formula (1) is the structure (x1) is particular preferable as the novolac phenol resin (B) used in the present invention.

The structure (x2) is a structure other than the structure (x1). Examples of the structure (x2) include phenol-based compounds other than the structure (x1), for example, an alkyl phenol (c1) described below and a structure obtained by random condensation of the alkyl phenol (c1) and an aromatic aldehyde (c2) described below. Notable effects of the present invention have been found by decreasing the structure (x2) content to less than 15% and thus the present invention has been made.

In formula (2) above, $R^1$ and $R^2$ each independently represent a hydrogen atom or an alkyl group having 1 to 8 carbon atoms, as described above. Although $R^1$ and $R^2$ may be the same or different, $R^1$ and $R^2$ preferably represent alkyl groups having the same number of carbon atoms. The carbon atoms of the aromatic hydrocarbon groups to which $R^1$ and $R^2$ are bonded are preferably at the same position with respect to a carbon atom bonded to a hydroxyl group of the aromatic hydrocarbon group.

A hydroxyl group is bonded to the aromatic hydrocarbon group to which $R^1$ is bonded and a hydroxyl group is bonded to the aromatic hydrocarbon group to which $R^2$ is bonded. The positions at which the hydroxyl groups are bonded are preferably the same in the respective aromatic hydrocarbon groups. Moreover, m and n are preferably equal. Among the novolac phenol resins (B), a novolac phenol resin having a structure in which $R^1$, $R^2$, and a hydroxyl group are arranged as such can be obtained by using one compound having a phenolic hydroxyl group as a raw material in the method for producing the novolac phenol resin (B) described below.

Examples of the structure represented by formula (2) above include the following structures:

[Chem. 11]

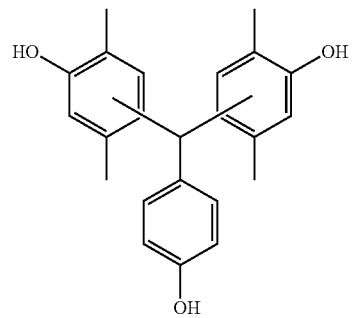
(2-1)

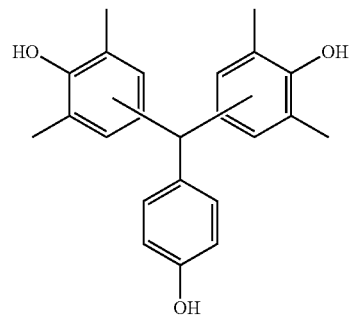
(2-2)

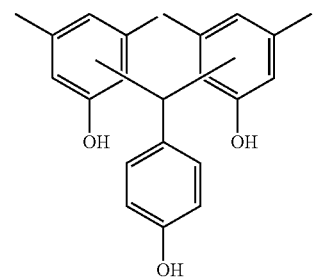
(2-3)

(2-4)
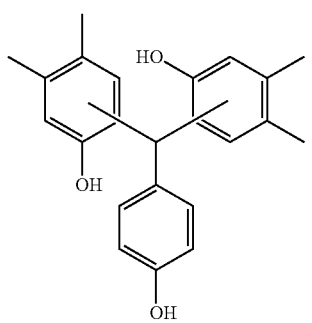
(2-5)
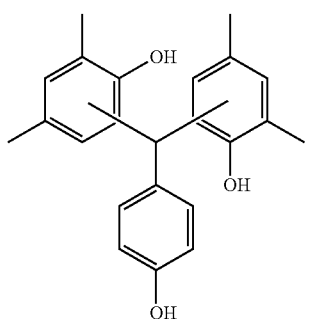
(2-6)
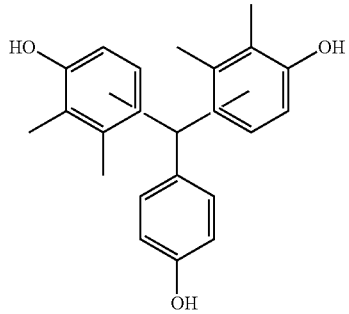
[Chem. 12]
(2-7)
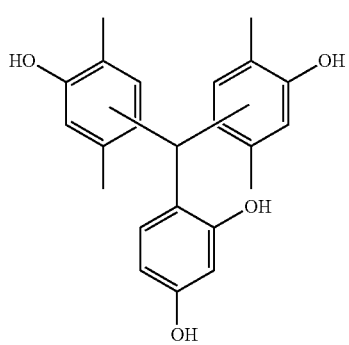
(2-8)
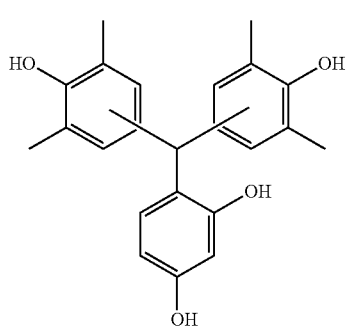
(2-9)
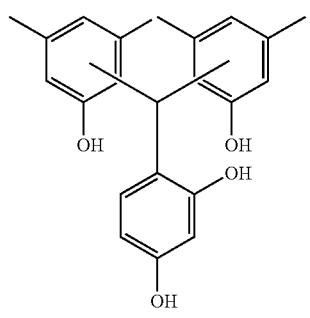
(2-10)
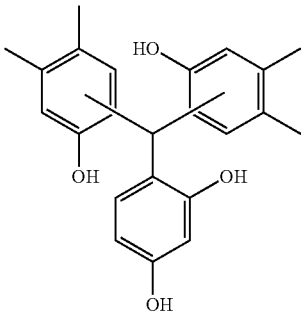
(2-11)
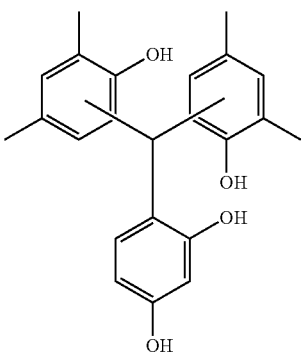
[Chem. 13]
(2-12)
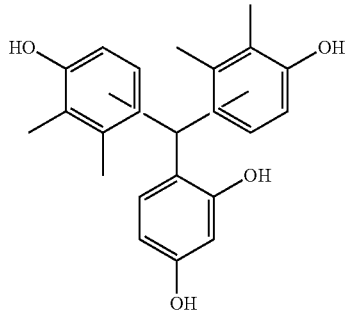
(2-13)
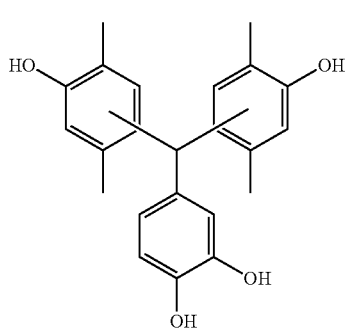

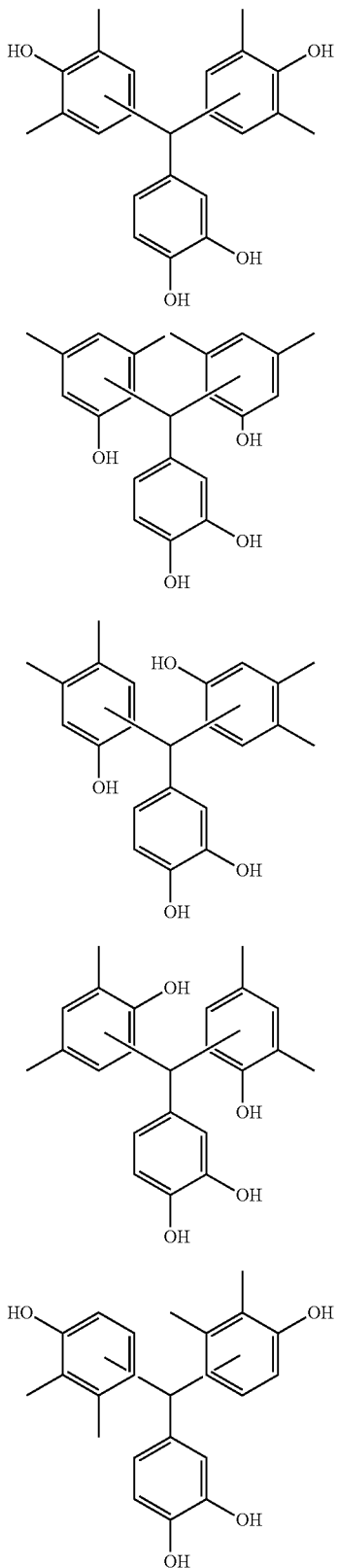

and (2-14) as the structure (x1) are preferred since a positive photoresist composition from which a coating film having heat resistance and high resolution is obtained is obtained. Among these, novolac phenol resins that have structures (2-1), (2-7), and (2-13) as the structure (x1) are preferred since a positive photoresist composition from which a coating film having particularly high heat resistance is obtained is obtained. A novolac phenol resin that has a structure (2-1) as the structure (x1) is more preferred.

When positive photoresist compositions that use novolac phenol resins containing structures (2-2), (2-8), and (2-14) as the structure (x1) are used to form coating films by using a sensitizer and without using a sensitizer, the ratio of the rate at which a coating film obtained from the system containing a sensitizer dissolves in an alkali to the rate at which a coating film obtained from the system containing a sensitizer dissolves in an alkali [(dissolution rate without sensitizer)/(dissolution rate with sensitizer)] is high. The ratio of the dissolution rate is preferably high since a positive photoresist composition is expected to achieve high development contrast. In particular, a positive photoresist composition that uses a novolac phenol resin having a structure (2-2) as the structure (x1) is preferred.

The same effects as those achieved with the structures (2-1) and (2-2) can be expected to be achieved by the structures shown below in which alkyl groups having a number of carbon atoms and preferably alkyl groups each having 2 to 8 carbon atoms are present at the same positions as where methyl groups are bonded in (2-1) and (2-2) above. Generic structures of (2-1) and (2-2) are described below.

[Chem. 14]

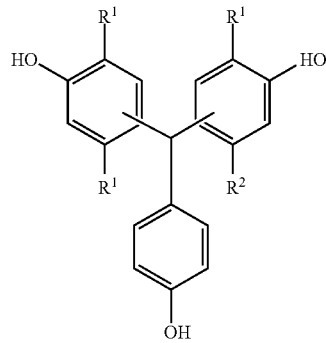

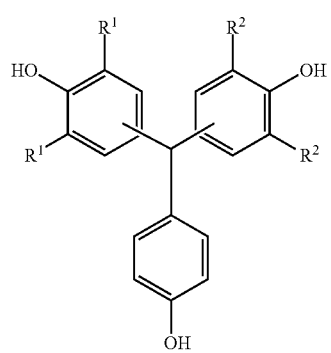

(In formulae, $R^1$ and $R^2$ each independently represent a PGP34 hydrogen atom or an alkyl group having 1 to 8 carbon atoms.)

Where there are more than one $R^1$, they may be the same or different. The same applies to $R^2$ and $R^3$.

Among the structures described above as examples of the structure represented by formula (2) above, novolac phenol resins that have structures (2-1), (2-2), (2-7), (2-8), (2-13), Preferable examples of the novolac phenol resin (B) used in the present invention include a novolac phenol resin that has a structure (2-19) above as (x1) in the repeating structural unit and a novolac phenol resin that has a structure (2-20) as (x1) in the repeating structural unit which are shown below:

[Chem. 15]

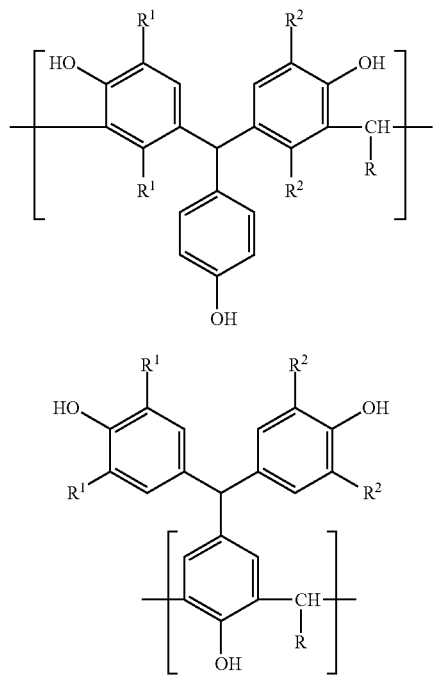

(In the formulae, R represents a hydrogen atom or a hydrocarbon group having 1 to 12 carbon atoms and $R^1$ and $R^2$ each independently represent a hydrogen atom or an alkyl group having 1 to 8 carbon atoms.)

When there are more than one $R^1$, they may be the same or different. The same applies to $R^2$ and $R^3$.

The weight-average molecular weight (Mw) of the novolac phenol resin having a repeating structural unit represented by formula (1-1) above is preferably 5,000 to 100,000, more preferably 5,000 to 70,000, yet more preferably 5,000 to 35,000, and most preferably 7,000 to 2,5000 to obtain a positive photoresist composition having excellent heat resistance and sensitivity.

The weight-average molecular weight (Mw) of the novolac phenol resin having a repeating structural unit represented by formula (1-2) above is preferably 1,000 to 5,000 and more preferably 2,000 to 4,000 since a positive photoresist composition having excellent heat resistance and sensitivity in addition to high development contrast is expected to be obtained.

In the present invention, the weight-average molecular weight (Mw) and the number-average molecular weight (Mn) are measured by gel permeation chromatography (referred to as "GPC" hereinafter) under the following measurement conditions.

[GPC Measurement Conditions]
Measurement instrument: "HLC-8220 GPC" produced by Tosoh Corporation
Columns: "Shodex KF802" (8.0 mmΦ×300 mm) produced by Showa Denko K.K.
"Shodex KF802" (8.0 mm Φ×300 mm) produced by Showa Denko K.K.
"Shodex KF803" (8.0 mm Φ×300 mm) produced by Showa Denko K.K.
"Shodex KF804" (8.0 mm Φ×300 mm) produced by Showa Denko K.K.
Column temperature: 40° C.
Detector: RI (differential refractometer)
Data processing: "GPC-8020 model II, version 4.30" produced by Tosoh Corporation
Eluent: tetrahydrofuran
Flow rate: 1.0 ml/min
Sample: microfiltered tetrahydrofuran solution containing 0.5% by mass of resin on a solid basis
Amount injected: 0.1 ml
Standard samples: monodisperse polystyrenes below:
(Standard Samples: Monodisperse Polystyrenes)
"A-500" produced by Tosoh Corporation
"A-2500" produced by Tosoh Corporation
"A-5000" produced by Tosoh Corporation
"F-1" produced by Tosoh Corporation
"F-2" produced by Tosoh Corporation
"F-4" produced by Tosoh Corporation
"F-10" produced by Tosoh Corporation
"F-20" produced by Tosoh Corporation Examples of the novolac phenol resin (B) used in the present invention include novolac phenol resins having structural units (1-1) and (1-2) which are examples of preferable structural units. Such novolac phenol resins are shown below.

[Chem. 16]

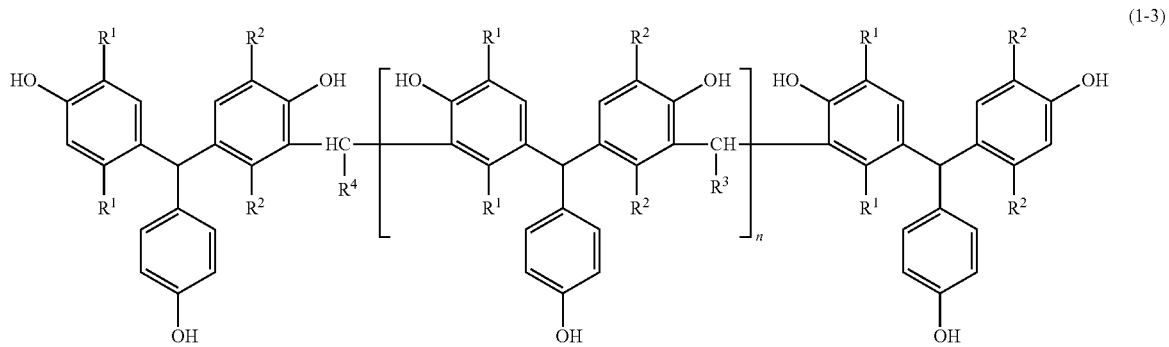

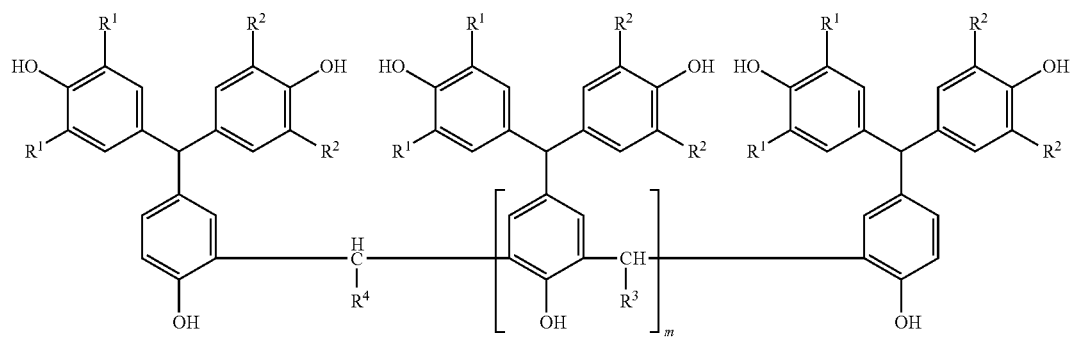

(1-4)

(In formulae, $R^1$ and $R^2$ each independently represent an alkyl group having 1 to 8 carbon atoms; $R^3$ and $R^4$ each independently represent a hydrogen atom or a hydrocarbon group having 1 to 8 carbon atoms; n is 10 to 400 on average; and m is 1 to 20 on average.)

Other examples of the novolac phenol resin (B) which contains a preferable structural unit (1-1) or (1-2) are as follows.

[Chem. 17]

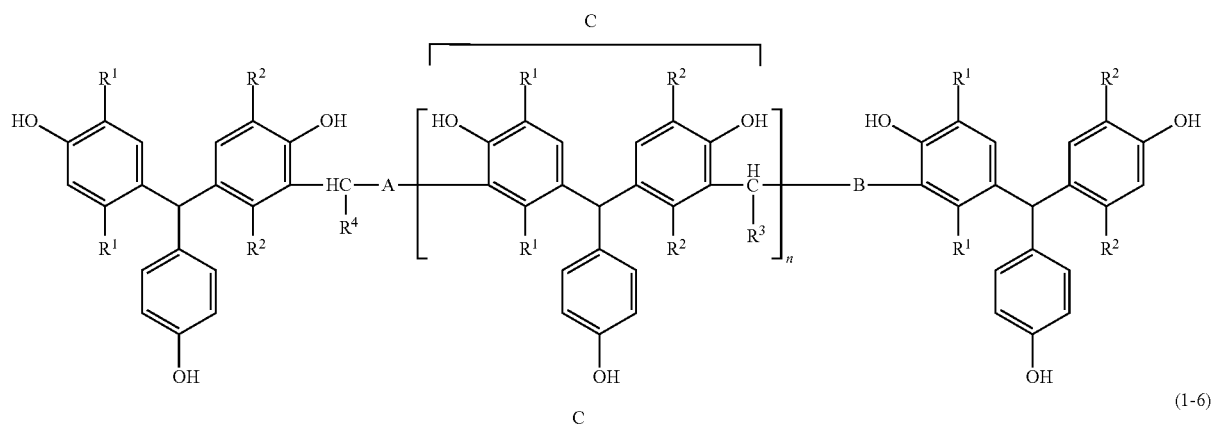

(1-5)

(1-6)

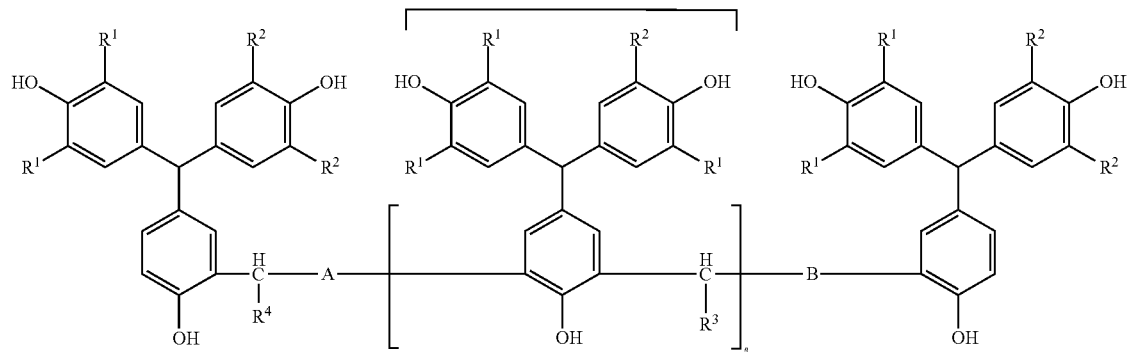

(In each formula, $R^1$, $R^2$, $R^3$, $R^4$, m, and n are the same as above; A and B are each a structural unit marked as C or a structural unit that has a structure (x2) as X in formula (1) above; when A and B are structural units marked by C, the total number n of repeating units is 10 to 400 on average; and m is 1 to 20 on average; two or more structural units A, two or more structural units B, and two or more structural units C may be present in the novolac phenol resin.)

The novolac phenol resin (B) used in the present invention is obtained by, for example, performing condensation of an alkyl-substituted phenol (c1) and a hydroxyl group-containing aromatic aldehyde (c2) under the conditions that can utilize the difference in activation energy among carbon atoms on the aromatic hydrocarbon group of the alkyl-substituted phenol (c1) to obtain a condensate (C) represented by formula (2) above and then performing condensation of the condensate (C) and an aldehyde-based compound (D).

The alkyl-substituted phenol (c1) is a compound in which some or all of hydrogen atoms bonded to the phenol aromatic ring are substituted by alkyl groups. Examples of the alkyl groups include alkyl groups having 1 to 8 carbon atoms. A methyl group is particularly preferable. Examples of the alkyl-substituted phenol (c1) include monoalkyl phenols such as o-cresol, m-cresol, p-cresol, o-ethylphenol, m-ethylphenol, p-ethylphenol, p-octylphenol, p-t-butylphenol, o-cyclohexylphenol, m-cyclohexylphenol, and p-cyclohexylphenol; dialkyl phenols such as 2,5-xylenol, 3,5-xylenol, 3,4-xylenol, 2,4-xylenol, and 2,6-xylenol; trialkyl phenols such as 2,3,5-trimethylphenol and 2,3,6-trimethylphenol. Among these alkyl-substituted phenols, alkyl-substituted phenols in which two hydrogen atoms of the phenol aromatic ring are substituted with alkyl groups are preferred since they have well balanced heat resistance and alkali-solubility. Preferable examples thereof include 2,5-xylenol and 2,6-xylenol. These alkyl-substituted phenols (c1) can be used alone or in combination.

The aromatic aldehyde (c2) is a compound that has at least one aldehyde group and at least one hydroxyl group on an aromatic ring. Examples of the aromatic aldehyde (c2) include hydroxybenzaldehydes such as salicylaldehyde, m-hydroxybenzaldehyde, and p-hydroxybenzaldehyde; dihydroxybenzaldehydes such as 2,4-dihydroxybenzaldehyde and 3,4-dihydroxybenzaldehyde; and vanillin-based compounds such as vanillin, ortho-vanillin, isovanillin, and ethyl vanillin. Among these aromatic aldehydes (c2), p-hydroxybenzaldehyde (4-hydroxybenzaldehyde), 2,4-dihydroxybenzaldehyde, and 3,4-dihydroxybenzaldehyde are preferred and p-hydroxybenzaldehyde is more preferred due to high industrial availability and good balance between heat resistance and alkali-solubility.

In the present invention, an aromatic aldehyde other than the aromatic aldehyde (c2) may be used in combination with the aromatic aldehyde (c2) as long as the effects of the present invention are not adversely affected. However, other aromatic aldehydes are preferably not used since it becomes difficult to obtain a compound represented by formula (2) above. Examples of the aromatic aldehyde other than the aromatic aldehyde (c2) include alkyl benzaldehydes such as p-tolualdehyde and cuminaldehyde; alkoxy benzaldehydes such as anisaldehyde and 3,4-dimethoxybenzaldehyde; phthalaldehyde such as terephthalaldehyde and isophthalaldehyde; naphthaldehydes such as 1-naphthaldehyde and 2-naphthaldehyde; and hydroxynaphthaldehyde such as 2-hydroxy-1-naphthaldehyde and 6-hydroxy-2-naphthaldehyde. Among these aromatic aldehydes, benzaldehyde, hydroxybenzaldehyde, and naphthaldehyde are preferred due to high industrial availability and good balance between heat resistance and alkali-solubility. These aromatic aldehydes (a2) may be used alone or in combination.

When an aromatic aldehyde having an alkyl group having 1 to 8 carbon atoms on the aromatic ring is used as the aromatic aldehyde (c2), a novolac phenol resin (B) that has excellent solubility in solvents can be obtained.

The condensate (C) represented by formula (2) above serving as a raw material of the novolac phenol resin (B) used in the present invention is in particular obtained by performing polycondensation of an alkyl-substituted phenol (c1) and an aromatic aldehyde (c2) in the presence of an acid catalyst (this step may also be referred to as a first step).

Examples of the acid catalyst include acetic acid, oxalic acid, sulfuric acid, hydrochloric acid, phenol sulfonic acid, para-toluene sulfonic acid, zinc acetate, and manganese acetate. These acid catalysts may be used alone or in combination. Among these acid catalysts, sulfuric acid and para-toluene sulfonic acid are preferred due to high activity. The acid catalyst may be added before the reaction or during the reaction.

Polycondensation of 2,5-xylenol and 4-hydroxybenzaldehyde in the presence of an acid catalyst gives a condensate represented by formula (2-1) above. Polycondensation of 2,6-xylenol and 4-hydroxybenzaldehyde in the presence of an acid catalyst gives a condensate represented by formula (2-2) above.

If needed, condensation of an alkyl-substituted phenol (c1) and a hydroxyl-group-containing aromatic aldehyde (c2) may be performed in the presence of a solvent to obtain a condensate represented by formula (2) above. Examples of the solvent include mono-alcohols such as methanol, ethanol, and propanol; polyols such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerin; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; cyclic ethers such as 1,3-dioxane and 1,4-dioxane; glycol esters such as ethylene glycol acetate; and ketones such as acetone, methyl ethyl ketone, and methyl isobutyl ketone. These solvents may be used alone or in combination. Among these solvents, 2-ethoxyethanol is particularly preferable since it satisfactorily dissolves the compound obtained.

The reaction temperature during the polycondensation of the alkyl-substituted phenol (a1) and the aromatic aldehyde (a2) is, for example, 60° C. to 140° C. The reaction time is, for example, 0.5 to 100 hours.

The feed ratio [(c1)/(c2)] of the alkyl-substituted phenol (c1) to the aromatic aldehyde (c2) is preferably in the range of 1/0.2 to 1/0.5 and more preferably in the range of 1/0.25 to 1/0.45 in terms of molar ratio since unreacted alkyl-substituted phenol (c1) can be smoothly removed and the product yield and the purity of the reaction product are high.

Examples of the polycondensate (C) obtained as a result of the polycondensation in the step 1 above include condensates represented by formulae (2-1) to (2) described above.

Unreacted materials such as (a1) and (a2) possibly remain in the reaction solution obtained in the first step along with the polycondensate (C). There is also a possibility that an undesirable condensate other than the condensate having a structure represented by formula (2) above is generated. If such a reaction solution is subjected to a reprecipitation operation with water to recover a material to be reacted with the aldehyde-based compound (D), the recovered material may contain large amounts of unreacted materials such as (a1) and (a2) described above and undesirable polycondensates along with the desired polycondensate (C).

Thus, it is preferable to recover the polycondensate (C) from the material recovered from the reaction solution so as to increase the purity of the polycondensate (C) as much as possible [the step of increasing the purity of the polycondensate (C) may also be referred to as a third step]. When a polycondensate (C) having an enhanced purity is used, it becomes easier to obtain a novolac phenol resin that has a high content of the structural unit in which X in formula (1) is the structure (x1). The crystallinity of the novolac phenol resin (B) obtained is increased by using a polycondensate (C) having an enhanced purity. A positive photoresist composition having excellent heat resistance and development sensitivity is obtained by adding such a novolac phenol resin (B) serving as a sensitivity enhancer to the cresol novolac resin (A).

The purity of the polycondensate (C) to be reacted with the aldehyde-based compound (D) is preferably 85% or more, more preferably 90% or more, yet more preferably 94% or more, still preferably 98% or more, and most preferably 100%. The purity of the polycondensate (C) can be determined based on the area ratio from a GPC chart.

An example of the method for enhancing the purity of the polycondensate (C) obtained in the second step is a method that includes adding the reaction solution obtained in the first step to a poor solvent (S1) that dissolves little or no polycondensate (C), separating the resulting precipitates by filtration, dissolving the precipitates in a solvent (S2) that dissolves the polycondensate (C) and is miscible with the poor solvent (S1), adding the resulting solution to the poor solvent (S1) again, and separating the resulting precipitates by filtration. Examples of the poor solvent (S1) used for this method include water; mono-alcohols such as methanol, ethanol, and propanol; aliphatic hydrocarbons such as n-hexane, n-heptane, n-octane, and cyclohexane; and aromatic hydrocarbons such as toluene and xylene. Among these poor solvents (S1), water and methanol are preferable since the acid catalyst can be removed simultaneously and efficiently.

Examples of the solvent (S2) include mono-alcohols such as methanol, ethanol, and propanol; polyols such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerin; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; cyclic ethers such as 1,3-dioxane and 1,4-dioxane; glycol esters such as ethylene glycol acetate; and ketones such as acetone, methyl ethyl ketone and methyl isobutyl ketone. In cases where water is used as the poor solvent (S1), the solvent (S2) is preferably acetone. For each of the poor solvent (S1) and the solvent (S2), one solvent may be used alone or two or more solvents may be used in combination.

The polycondensate (C) obtained through the first step or through the first and second steps and the aldehyde-based compound (D) are subjected to condensation in the presence of an acid catalyst. As a result, a novolac phenol resin used in the present invention is obtained (this step may be referred to as a third step).

Specific examples of the aldehyde-based compound (D) include form formaldehyde, para-formaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, and salicylaldehyde. These aldehyde-based compounds (D) can be used alone or in combination. Formaldehyde is preferably used as the aldehyde-based compound (D). Formaldehyde may be used in combination with another aldehyde-based compound. When formaldehyde is used in combination with another aldehyde-based compound, the amount of this other aldehyde-based compound is preferably in the range of 0.05 to 1 mol per mole of formaldehyde.

An acid catalyst that can be used in the first step may be used as the acid catalyst, for example. The acid catalyst is preferably sulfuric acid, oxalic acid, or zinc acetate. The acid catalyst may be added before the reaction or during the reaction.

In the third, step, if needed, the polycondensate (C) and the aldehyde-based compound (D) may be reacted in the presence of a solvent. A solvent that may be used in the first step as needed may be used as this solvent if needed. One or a combination of two or more solvents can be used. Among the solvents, 2-ethoxyethanol is preferred since it smoothly dissolves the compound obtained.

The feed ratio [(C)/(D)] of the polycondensate (C) to the aldehyde-based compound (D) in terms of molar ratio in step 3 is preferably in the range of 1/0.5 to 1/1.2 and more preferably in the range of 1/0.6 to 1/0.9 since an excessive increase in molecular weight (gelation) can be suppressed and a phenol resin having an appropriate molecular weight for photoresists can be obtained.

The positive photoresist composition of the present invention contains, as the alkali-soluble resin, the cresol novolac resin (A) and the novolac phenol resin (B). The positive photoresist composition of the present invention may further contain another alkali-soluble compound (E) as long as the effects of the present invention are not adversely affected.

The alkali-soluble compound (E) may be any compound soluble in alkaline aqueous solutions. Examples thereof include polyhydroxybenzophenone-based compounds such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone; bis[(poly)hydroxyphenyl]alkane-based compounds such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol, and 3,3'-dimethyl-{1-[4-[2-(3-methyl-4-hydroxyphenyl)-2-propyl]phenyl]ethylidene}bisphenol;
methanes and methyl-substituted methanes such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane; and
bis(cyclohexylhydroxyphenyl)(hydroxyphenyl)methanes and methyl-substituted bis(cyclohexylhydroxyphenyl)(hydroxyphenyl)methanes such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis (3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2- hydroxyphenylmethane, and bis(5-cyclohexyl-2-hydroxy-4-methylphenyl)-4-hydroxyphenylmethane, and hydroxyl group-containing cyclic compounds such as calix[4]arene, calix[6]arene, calix[8]arene, pillar[5]arene, resorcin[4]arene, α-cyclodextrin, β-cyclodextrin, and γ-cyclodextrin.

The positive photoresist composition according to the present invention usually contains a sensitizer (F) and a solvent (G) in addition to the novolac phenol resin (A), the novolac phenol resin (B), and the alkali-soluble compound (E), which is an optional component.

Compounds having quinonediazide groups can be used as the sensitizer (F). Examples of the compounds having quinonediazide groups include polyhydroxybenzophenone-based compounds such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone;

bis[(poly)hydroxyphenyl]alkane-based compounds such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol, and 3,3'-dimethyl-{1-[4-[2-(3-methyl-4-hydroxyphenyl)-2-propyl]phenyl]ethylidene}bisphenol; tris(hydroxyphenyl)methanes and methyl-substituted tris(hydroxyphenyl)methanes such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane; and fully esterified compounds, partially esterified compounds, amidated compounds, and partially amidated compounds between unsubstituted or methyl-substituted bis(cyclohexylhydroxyphenyl)(hydroxyphenyl)methanes and sulfonic acids having quinonediazide groups. Examples of the unsubstituted or methyl-substituted bis(cyclohexylhydroxyphenyl)(hydroxyphenyl)methanes include bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane, and bis(5-cyclohexyl-2-hydroxy-4-methylphenyl)-4-hydroxyphenylmethane. Examples of the sulfonic acids having quinonediazide groups include naphthoquinone-1,2-diazide-5-sulfonic acid, naphthoquinone-1,2-diazide-4-sulfonic acid, and ortho-anthraquinone diazide sulfonic acid. These sensitizers (F) may be used alone or in combination.

The amount of the sensitizer (F) blended in the positive photoresist composition of the present invention is preferably in the range of 3 to 50 parts by mass and more preferably 5 to 30 parts by mass relative to the total of 100 parts by mass of the novolac phenol resin (A), the novolac phenol resin (B), and the alkali-soluble compound (E), which is an optional component, in order to achieve high sensitivity and desired patterns.

Examples of the solvent (G) include ethylene glycol alkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetate such as methyl cellosolve acetate and ethyl cellosolve acetate; propylene glycol alkyl ether acetate such as propylene glycol monomethyl ether acetate, propylene glycol monoethyl ether acetate, and propylene glycol monopropyl ether acetate; ketones such as acetone, methyl ethyl ketone, cyclohexanone, and methyl amyl ketone; cyclic ethers such as dioxane; and esters such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methyl butanoate, 3-methoxybutyl acetate, 3-methyl-3-methoxybutyl acetate, ethyl formate, ethyl acetate, butyl acetate, methyl acetoacetate, and ethyl acetoacetate. These solvents (G) may be used alone or in combination.

The amount of the solvent (G) in the positive photoresist composition of the present invention is preferably 15% to 65% by mass in terms of a solid content in the composition since the composition exhibits flowability that allows formation of a homogeneous coating film by a coating method such as a spin coating method.

The positive photoresist composition according to the present invention may contain various additives in addition to the novolac phenol resin (A), the novolac phenol resin (B), and optional components such as the alkali-soluble compound (E), the sensitizer (F), and the solvent (G) as long as the effects of the present invention are not adversely affected. Examples of the additives include a filler, a pigment, a surfactant such as a leveling agent, an adhesion-improver, and a dissolution accelerator.

The positive photoresist composition according to the present invention can be prepared by stirring and mixing the novolac phenol resin (A), the novolac phenol resin (B), and the optional components, which are the alkali-soluble compound (E), the sensitizer (F), the solvent (G), and, if needed, various additives by a common method into a homogeneous solution.

In the case where solid materials such as a filler, a pigment, etc., are added to the positive photoresist composition according to the present invention, dispersion and mixing are preferably conducted by using a dispersion machine such as a dissolver, a homogenizer, and a triple roll mill. In order to remove coarse particles and impurities, the composition may be filtered through a mesh filter, a membrane filter, or the like.

A coating film according to the present invention is obtained by applying and drying the positive photoresist composition described above. In particular, a coating film according to the present invention is, for example, obtained by applying the positive photoresist composition of the present invention to a substrate and drying the applied composition.

When the positive photoresist composition of the present invention is exposed to light through a mask, the resin composition in exposed portions undergoes structural changes and exhibits increased alkali-solubility. In contrast, the alkali-solubility remains low in un-exposed portions. This difference in solubility enables patterning by using alkali development and thus the composition can be used as a resist material.

Examples of the light source used to expose the positive photoresist composition of the present invention include infrared light, visible light, ultraviolet light, far-ultraviolet light, X-rays, and electron beams. Among these light sources, ultraviolet light is preferred. The g line (wavelength: 436 nm) and i line (wavelength: 365 nm) of a high-pressure mercury lamp, a KrF excimer laser (wavelength: 248 nm), and an ArF excimer laser (wavelength: 193 nm) are preferable.

Examples of the alkaline developer used for development after exposure include alkaline aqueous solutions of inorganic alkaline substances such as sodium hydroxide, potassium hydroxide, sodium carbonate, sodium silicate, sodium metasilicate, and ammonia water; primary amines such as ethyl amine and n-propyl amine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. These alkaline developers can contain alcohols, surfactants, etc., as needed. The alkali concentration of the alkaline developer is usually preferably 2% to 5% by mass. A 2.38 mass % aqueous tetramethylammonium hydroxide solution is commonly used.

EXAMPLES

The present invention will now be described in further detail by way of specific examples below. The GPC measurement conditions were as follows.
[GPC Measurement Conditions]
Measurement instrument: "HLC-8220 GPC" produced by Tosoh Corporation
Columns: "Shodex KF802" (8.0 mm Φ×300 mm) produced by Showa Denko K.K.
"Shodex KF802" (8.0 mm Φ×300 mm) produced by Showa Denko K.K.
"Shodex KF803" (8.0 mm Φ×300 mm) produced by Showa Denko K.K.
"Shodex KF804" (8.0 mm Φ×300 mm) produced by Showa Denko K.K.
Column temperature: 40° C.
Detector: RI (differential refractometer)
Data processing: "GPC-8020 model II, version 4.30" produced by Tosoh Corporation
Eluent: tetrahydrofuran
Flow rate: 1.0 ml/min
Sample: microfiltered tetrahydrofuran solution containing 0.5% by mass of resin on a solid basis
Amount injected: 0.1 ml
Standard samples: monodisperse polystyrenes below:
(Standard samples: monodisperse polystyrenes)
"A-500" produced by Tosoh Corporation
"A-2500" produced by Tosoh Corporation
"A-5000" produced by Tosoh Corporation
"F-1" produced by Tosoh Corporation
"F-2" produced by Tosoh Corporation
"F-4" produced by Tosoh Corporation
"F-10" produced by Tosoh Corporation
"F-20" produced by Tosoh Corporation
Measurement of a $^{13}$C-NMR spectrum and a $^1$H-NMR spectrum were conducted with "AL-400" produced by JEOL Ltd., and the structural analysis was conducted by analyzing a DMSO-$d_6$ solution of the sample. The measurement conditions for $^{13}$C-NMR are shown below.
[$^{13}$C-NMR Measurement Conditions]
Measurement mode: SGNNE (NOE-suppressed 1H complete decoupling method)
Pulse angle: 45° C. pulse
Sample concentration: 30 wt %
Number of transients: 10000

Synthetic Example 1

Synthesis of Cresol Novolac Resin (A)

Into a 2 L four-necked flask equipped with a stirrer and a thermometer, 648 g of m-cresol, 432 g of p-cresol, 2.5 g of oxalic acid, and 534 g of a 42 mass % formaldehyde aqueous solution were charged, heated to 100° C., and reacted for 3 hours. The resulting mixture was then heated to 210° C. and the pressure was reduced to conduct dehydration and distillation. As a result, 948 g of a cresol novolac resin (A1) was obtained. The cresol novolac resin (A1) was subjected to GPC measurement and found to have a number-average molecular weight (Mn) of 2,715, weight-average molecular weight (Mw) of 19,738, and a polydispersity (Mw/Mn)=7.270.

Synthetic Example 2

Synthesis of Polycondensate (C)

Figure 2:
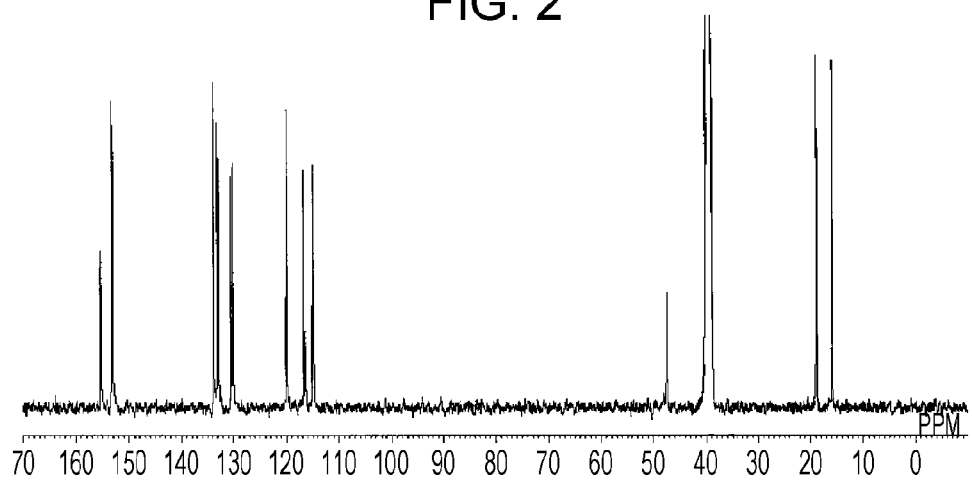
FIG. 2 is a $^{13}$C-NMR spectrum chart of the polycondensate (C1) obtained in Synthetic Example 2.
Figure 3:
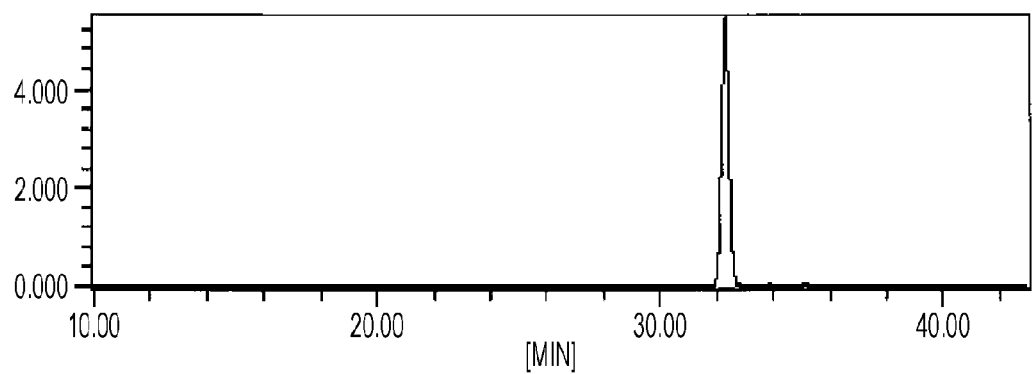
FIG. 3 is a GPC chart of the polycondensate (C1) obtained in Synthetic Example 2.

Into a 100 ml two-necked flask equipped with a cooling tube and a thermometer, 3.66 g of 2,5-xylenol and 1.22 g of 4-hydroxybenzaldehyde were charged and dissolved in 10 ml of 2-ethoxyethanol. To the resulting mixture, 1 ml of sulfuric acid was added while the mixture was being cooled in an ice bath. Then the mixture was heated at 100° C. for 2 hours, stirred, and reacted. After the reaction, the solution obtained was re-precipitated with water to obtain a recovered material [a crude product of a polycondensate (C)]. The crude product of a polycondensate (C) was re-dissolved in acetone and re-precipitated with water. The resulting product was filtered and vacuum dried. As a result, 2.82 g of a polycondensate (C1) in form of light brown crystals represented by formula (2-1) below was obtained. The purity of the polycondensate (C) as the crude product was 87% by mass in terms of GPC area ratio and the purity of the polycondensate (C1) was 94% by mass. A $^1$H-NMR spectrum chart of the polycondensate (C1) is shown in FIG. 1, a $^{13}$C-NMR spectrum chart is shown in FIG. 2, and a GPC chart is shown in FIG. 3. The $^1$H-NMR spectrum assignments and the $^{13}$C-NMR spectrum assignments were as follows.
<$^1$H-NMR Spectrum Assignments>
δ/ppm 9.2 (—OH), 8.9 (—OH), 6.3 to 6.8 (Ar—H), 5.3 (>CH—), 2.0 (—CH$_3$)
<$^{13}$C-NMR Spectrum Assignments>
13C-NMR assignments of C1
δ/ppm 115 to 155 (ArC), 48 (>CH—), 19 (CH3), 16 (CH3)

[Chem. 18]

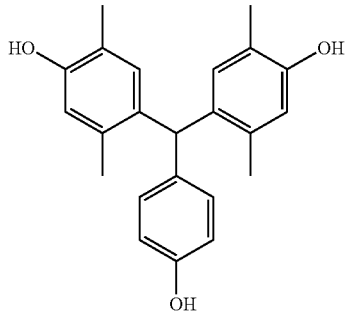

(2-1)

Synthetic Example 3

The Same as Above

Figure 4:
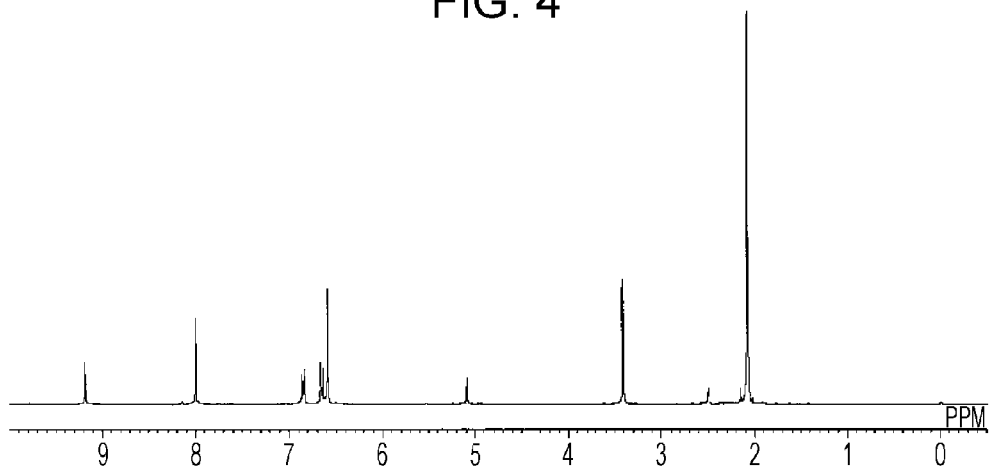
FIG. 4 is a $^1$H-NMR spectrum chart of a polycondensate (C2) obtained in Synthetic Example 3.
Figure 5:
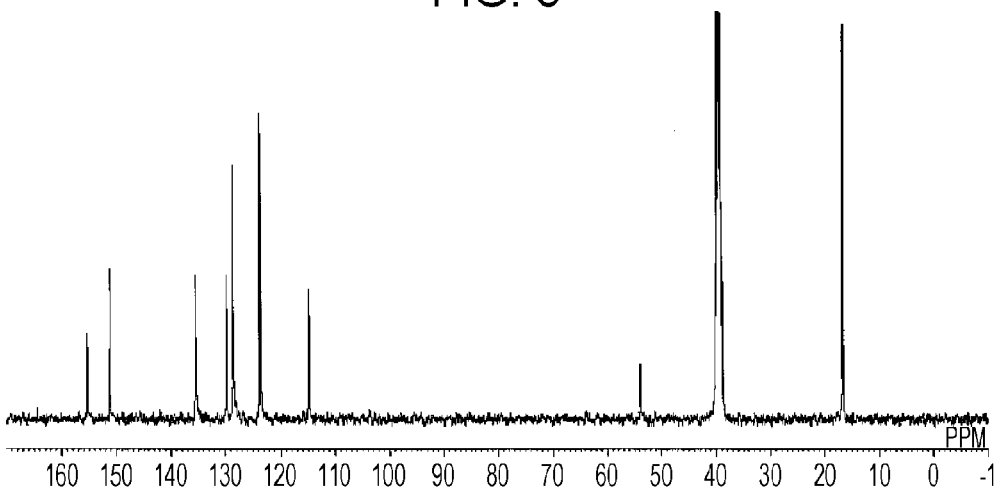
FIG. 5 is a $^{13}$C-NMR spectrum chart of the polycondensate (C2) obtained in Synthetic Example 3.
Figure 6:
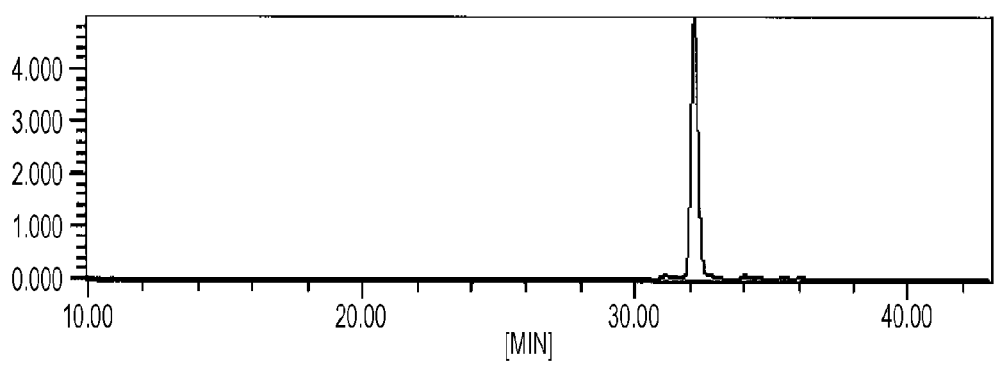
FIG. 6 is a GPC chart of the polycondensate (C2) obtained in Synthetic Example 3.

The same operation as Synthetic Example 2 was conducted except that 2,5-xylenol used in Synthetic Example 2 was changed to 2,6-xylenol. As a result, 2.85 g of a polycondensate (C2) in form of orange crystals represented by formula (3) was obtained. The purity of the polycondensate (C) as the crude product was 82% by mass in terms of GPC area ratio and the purity of the polycondensate (C2) was 94% by mass. A $^1$H-NMR spectrum chart of the polycondensate (C2) is shown in FIG. 4, a $^{13}$C-NMR spectrum chart is shown in FIG. 5, and a GPC chart is shown in FIG. 6. The $^1$H-NMR spectrum assignments and the $^{13}$C-NMR spectrum assignments were as follows.

<$^1$H-NMR Spectrum Assignments>
δ/ppm 9.2 (—OH), 8.0 (—OH), 6.6 to 6.8 (Ar—H), 5.1 (>CH—), 2.1 (—CH3)
<$^{13}$C-NMR Spectrum Assignments>
δ/ppm 115 to 155 (ArC), 54 (>CH—), 17 (CH3)

[Chem. 19]

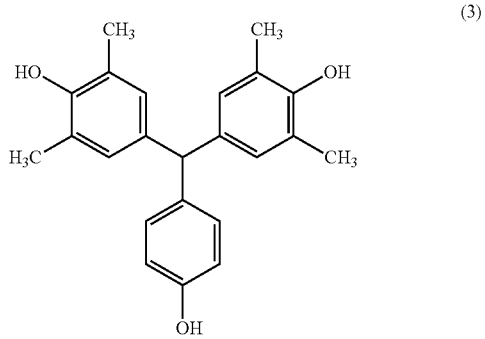

(3)

Synthetic Example 4

Synthesis of Phenol Novolac Resin (B)

Into a 100 ml two-necked flask equipped with a cooling tube and a thermometer, 1.74 g of the polycondensate (C1) obtained in Synthetic Example 2 and 0.16 g of a 92 mass % paraformaldehyde were charged and dissolved in 5 ml of 2-ethoxyethanol and 5 ml of acetic acid. To the resulting mixture, 0.5 ml of sulfuric acid was added while the mixture was being cooled in an ice bath. The resulting mixture was heated at 70° C. for 4 hours, stirred, and reacted. After the reaction, the solution obtained was re-precipitated with water to obtain a crude product. The crude product was re-dissolved in acetone and re-precipitated with water. The resulting product was filtered and vacuum dried. As a result, a phenol novolac resin (B1) in form of light brown powder was obtained. The phenol novolac resin (B1) was subjected to GPC measurement and found to have a number-average molecular weight (Mn) of 6,601, a weight-average molecular weight (Mw) of 14,940, and a polydispersity (Mw/Mn)=2.263.

Figure 7:
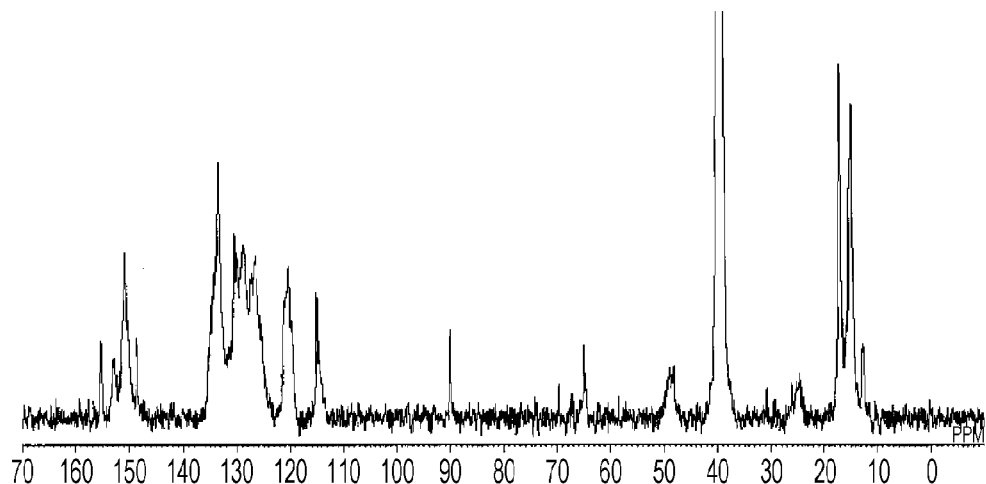
FIG. 7 is a $^{13}$C-NMR spectrum chart of a phenol novolac resin (B1) obtained in Synthetic Example 4.
Figure 8:
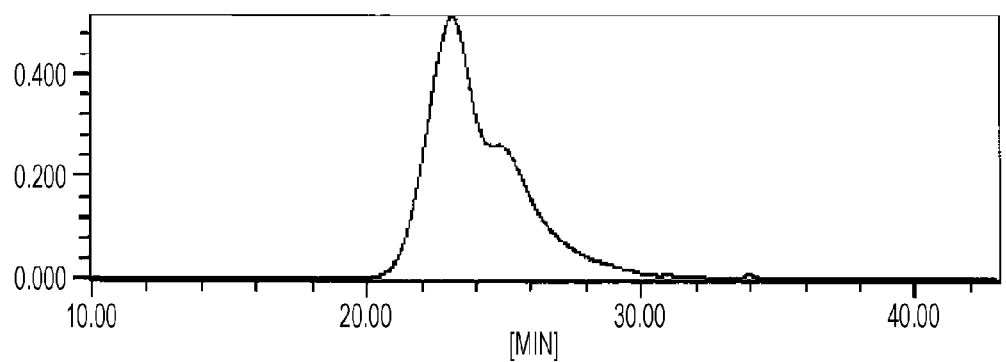
FIG. 8 is a GPC chart of the phenol novolac resin (B1) obtained in Synthetic Example 4.

Based on the fact that the purity of the polycondensate (C1) is 94% by mass and that compounds having phenolic hydroxyl groups are not added except for the polycondensate (C1) in preparing the phenol novolac resin (B1), it is clear that the phenol novolac resin (B1) has a structure (x1) content of 85% or more relative to the total number of the structures (x1) and (x2) in formula (1). A $^{13}$C-NMR spectrum chart of the phenol novolac resin (B1) is shown in FIG. 7 and a GPC chart is shown in FIG. 8. The $^{13}$C-NMR spectrum assignments were as follows.

<$^{13}$C-NMR Spectrum Assignments>
δ/ppm 115 to 155 (ArC), 49 (>CH—), 25 (—CH2-), 17 (CH3), 15 (CH3)

Synthetic Example 5

The Same as Above

The same operation as Synthetic Example 3 was conducted except that the polycondensate (C1) used in Synthetic Example 2 was changed to the polycondensate (C2) obtained in Synthetic Example 3. As a result, 1.68 g of a phenol novolac resin (B2) in form of light brown powder was obtained. The phenol novolac resin (B2) was subjected to GPC measurement and found to have a number-average molecular weight (Mn) of 1,917, a weight-average molecular weight (Mw) of 2,763, and a polydispersity (Mw/Mn)=1.441.

Figure 9:
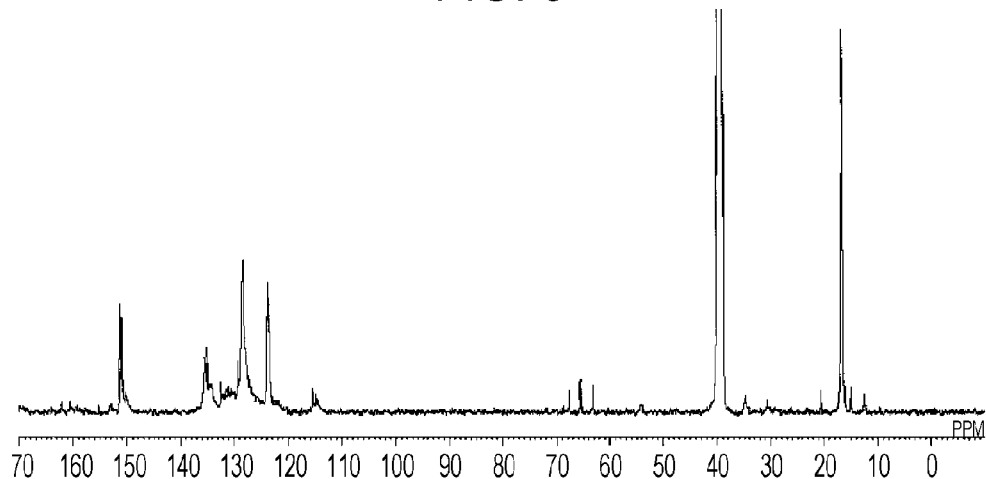
FIG. 9 is a $^{13}$C-NMR spectrum chart of a phenol novolac resin (B2) obtained in Synthetic Example 5.
Figure 10:
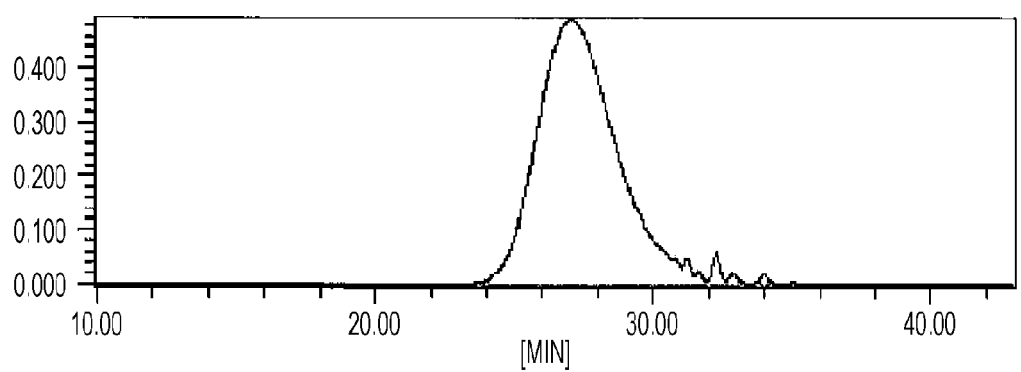
FIG. 10 is a GPC chart of the phenol novolac resin (B2) obtained in Synthetic Example 5.

Based on the fact that the purity of the polycondensate (C2) is 94% by mass or more and that compounds having phenolic hydroxyl groups are not added except for the polycondensate (C2) in preparing the phenol novolac resin (B2), it is clear that the phenol novolac resin (B2) has a structure (x1) content of 85% or more relative to the total number of the structures (x1) and (x2) in formula (1). A $^{13}$C-NMR spectrum chart of the phenol novolac resin (B2) is shown in FIG. 9 and a GPC chart is shown in FIG. 10. The $^{13}$C-NMR spectrum assignments were as follows.

<$^{13}$C-NMR Spectrum Assignments>
δ/ppm 124 to 151 (ArC), 54 (>CH—), 35 (—CH2-), 17 (CH3)

Synthetic Example 6

Synthesis of Comparative Novolac Resin (H1)

Into a 2 L four-necked flask equipped with a stirrer and a thermometer, 324 g of o-cresol, 324 g of p-cresol, 1.5 g of oxalic acid, and 390 g of a 42 mass % aqueous formaldehyde solution were charged, heated to 100° C., and reacted for 7 hours. The resulting mixture was then heated to 200° C. at a normal pressure and dehydration and distillation were conducted. Then vacuum distillation was conducted at 200° C. for 2 hours. As a result, 432 g of a comparative novolac resin (H1) was obtained. The comparative novolac resin (H1) was subjected to GPC measurement and found to have a number-average molecular weight (Mn) of 958, a weight-average molecular weight (Mw) of 1,245, and a polydispersity (Mw/Mn)=1.300.

Example 1

To 80 parts by mass of propylene glycol monomethyl ether acetate (hereinafter referred to as "PGMEA"), 11 parts by mass of the cresol novolac resin (A1) and 5 parts by mass of the phenol novolac resin (B1) were added, mixed and dissolved to obtain a solution. To the solution, 4 parts by mass of a sensitizer ("P-200" produced by Toyo Gosei Co., Ltd.; a condensate of 1 mol of 4,4'-[1-[4-[1-(4-hydroxyphenyl)-1methylethyl]phenyl]ethylidene]bisphenol and 2 mol of 1,2-naphthoquinone-2-diazide-5-sulfonyl chloride) was added, mixed, and dissolved to obtain a positive photoresist composition (1). A positive photoresist composition (1') was also prepared by the same operation but without using the sensitizer. The positive photoresist compositions (1) and (1') were used to measure the alkali dissolution rate, evaluate sensitivity, measure a glass transition point, and evaluate heat resistance by the following procedures.

[Measurement of Alkali Dissolution Rate and Evaluation of Sensitivity]

Each of the positive photoresist composition (1) containing a sensitizer and the positive photoresist composition (1') not containing a sensitizer was applied to a silicon wafer having a diameter of 5 inch by using a spin coater. The applied composition was dried at 110° C. for 60 seconds to obtain a thin film having a thickness of 1 μm. The thin film was immersed in an alkaline solution (a 2.38 mass % aqueous tetramethylammonium hydroxide solution) for 60 seconds and the thickness after the immersion was measured with a thickness meter ("F-20" produced by Filmetrics) to measure the alkali dissolution rate (ADR). Based on the observed values, the sensitivity and the alkali solution resistance were evaluated according to the following criteria. The ratings given to the positive photoresist composition not containing a sensitizer are the ratings given to exposed portions of the positive photoresist composition coating film and the ratings given to the positive photoresist composition containing a sensitizer are the ratings given to unexposed portions of the positive photoresist composition coating film.

(Criteria of Evaluating Sensitivity of Positive Photoresist Composition not Containing Sensitizer)
A: Alkali dissolution rate is 20 nm/sec or more
B: Alkali dissolution rate is 10 nm/sec or more and less than 20 nm/sec
C: Alkali dissolution rate is less than 10 nm/sec.

(Criteria of Evaluating Alkali Solution Resistance of Positive Photoresist Composition Containing Sensitizer)
A: Alkali dissolution rate is less than 0.5 nm/sec
B: Alkali dissolution rate is 0.5 nm/sec or more and less than 1.0 nm/sec
C: Alkali dissolution rate is more than 1.0 nm/sec.

[Measurement of Glass Transition Point and Evaluation of Heat Resistance]

The positive photoresist composition (1) was applied to a silicon wafer having a diameter of 5 inch by using a spin coater and dried at 110° C. for 60 seconds. As a result, a thin film having a thickness of 1 μm was obtained. This thin film was scraped off and the glass transition point (hereinafter referred to as "Tg") was measured. The Tg was measured with a differential scanning calorimeter ("differential scanning calorimeter (DSC) □100" produced by TA Instruments) in a nitrogen atmosphere in the temperature range of −100° C. to 200° C. at a heating rate of 10° C./min. The heat resistance was evaluated by the following criteria from the observed Tg values.
A: Tg is 130° C. or higher.
C: Tg is less than 130° C.

Example 2

The same operation as Example 1 was conducted except that the phenol novolac resin (B2) was used instead of the phenol novolac resin (B1) to prepare a positive photoresist composition (2) containing a sensitizer and a positive photoresist composition (2') not containing a sensitizer. Measurement of alkali dissolution rate, evaluation of sensitivity, measurement of glass transition point, and evaluation of heat resistance were performed as in Example 1.

Comparative Example 1

The same operation as Example 1 was conducted except that the polycondensate (C1) was used instead of the phenol novolac resin (B1) to prepare a positive photoresist composition (3) containing a sensitizer and a positive photoresist composition (3') not containing a sensitizer. Measurement of alkali dissolution rate, evaluation of sensitivity, measurement of glass transition point, and evaluation of heat resistance were performed as in Example 1.

Comparative Example 2

The same operation as Example 1 was conducted except that the polycondensate (C2) was used instead of the phenol novolac resin (B1) to prepare a positive photoresist composition (4) containing a sensitizer and a positive photoresist composition (4') not containing a sensitizer. Measurement of alkali dissolution rate, evaluation of sensitivity, measurement of glass transition point, and evaluation of heat resistance were performed as in Example 1.

Comparative Example 3

The same operation as Example 1 was conducted except that the phenol novolac resin (H1) was used instead of the phenol novolac resin (B1) to prepare a positive photoresist composition (5) containing a sensitizer and a positive photoresist composition (5') not containing a sensitizer. Measurement of alkali dissolution rate, evaluation of sensitivity, measurement of glass transition point, and evaluation of heat resistance were performed as in Example 1.

Comparative Example 4

The same operation as Example 1 was conducted except that 2,3,4,4'-tetrahydroxybenzophenone (produced by Wako Chemical Industries, Ltd., hereinafter referred to as "THBP") was used instead of the phenol novolac resin (B1) to prepare a positive photoresist composition (6) containing a sensitizer and a positive photoresist composition (6') not containing a sensitizer. Measurement of alkali dissolution rate, evaluation of sensitivity, measurement of glass transition point, and evaluation of heat resistance were performed as in Example 1.

Comparative Example 5

To 80 parts by mass of PGMEA, 16 parts by mass of cresol novolac resin (A1) was added, mixed and dissolved to obtain a solution. To the solution, 4 parts by mass of a sensitizer ("P-200" produced by Toyo Gosei Co., Ltd.; a condensate of 1 mol of 4,4'-[1-[4-[1-(4-hydroxyphenyl)-1methylethyl]phenyl]ethylidene]bisphenol and 2 mol of 1,2-naphthoquinone-2-diazide-5-sulfonyl chloride) was added, mixed, and dissolved to obtain a positive photoresist composition (7). The same operation was also conducted to prepare a positive photoresist composition not containing a sensitizer. Measurement of alkali dissolution rate, evaluation of sensitivity, measurement of glass transition point, and evaluation of heat resistance were performed as in Example 1 by using these compositions.

The results of measurements and evaluations conducted on the positive photoresist compositions (1) to (7) and (1') to (7') obtained in Examples 1 and 2 and Comparative Examples 1 and 2 are shown in Table 1. In the table, (B1), (B2), and (H1) respectively represent a phenol novolac resin (B1), a phenol novolac resin (82), and a phenol novolac resin (H1).

TABLE 1

|  |  | Example 1 | Example 2 | Comparative Example 1 | Comparative Example 2 | Comparative Example 3 | Comparative Example 4 | Comparative Example 5 |
|---|---|---|---|---|---|---|---|---|
| Positive photoresist composition (with sensitizer/without sensitizer) | | (1)/(1') | (2)/(2') | (3)/(3') | (4)/(4') | (5)/(5') | (6)/(6') | (7)/(7') |
| Sensitivity enhancer | | (B1) | (B2) | (C1) | (C2) | (H1) | THBP | None |
| Evaluation results | ADR without sensitizer (nm/sec) | 21 | 32 | 59 | 36 | 19 | 105 | 1.5 |
|  | Sensitivity | A | A | A | A | B | A | C |
|  | ADR with sensitizer (nm/sec) | 0.2 | 0.1 | 0.6 | 0.7 | 0.4 | 0.8 | 0.1 |
|  | Alkali solution resistance | A | A | B | B | A | B | A |
|  | Tg (° C.) | 147 | 133 | 107 | 105 | 83 | 102 | 117 |
|  | Heat resistance | A | A | C | C | C | C | C |

The evaluation results in Table 1 show the following. The positive photoresist compositions (1)/(1') of the present invention obtained in Example 1 are examples that use the novolac phenol resin (B1) as a sensitivity enhancer. It was found that the positive photoresist composition (1') not containing a sensitizer and corresponding to unexposed portions had a significantly high alkali dissolution rate of 21 nm/sec and excellent sensitivity. It was also found that the positive photoresist composition (1) containing a sensitizer and corresponding to unexposed portions had a significantly low alkali dissolution rate of 0.2 nm/sec and the pattern remained without any defects after the alkali development. Moreover, a coating film of the positive photoresist composition (1) had a Tg as high as 147° C. and exhibited excellent heat resistance.

The positive photoresist compositions (2)/(2') of the present invention obtained in Example 2 are examples that use the novolac phenol resin (B2) as a sensitivity enhancer. It was found that the positive photoresist composition (2') not containing a sensitizer and corresponding to unexposed portions had a significantly high alkali dissolution rate of 32 nm/sec and excellent sensitivity. It was also found that the positive photoresist composition (2) containing a sensitizer and corresponding to unexposed portions had a significantly low alkali dissolution rate of 0.1 nm/sec and the pattern remained without any defects after the alkali development. Moreover, a coating film of the positive photoresist composition (2) had a Tg as high as 133° C. and exhibited excellent heat resistance.

In Example 2, the ratio [(2')/(2)] of the alkali dissolution rate of the positive photoresist composition (2') to the alkali dissolution rate of the positive photoresist composition (2) is as high as 320. When the ratio is high, the positive photoresist composition is expected to exhibit high development contrast. The positive photoresist composition of Example 2 is expected to achieve higher development contrast than not only the positive photoresist compositions of the comparative examples but also the positive photoresist composition of Example 1.

In contrast, the positive photoresist compositions (3)/(3') of Comparative Example 1 are examples that use, as a sensitivity enhancer, the polycondensate (C1) before being turned into the novolac phenol resin (B). The positive photoresist composition (3') not containing a sensitizer and corresponding to exposed portions had a significantly high alkali dissolution rate of 59 nm/sec. However, the alkali dissolution rate of the positive photoresist composition (3) containing the sensitizer and corresponding to unexposed portions was 0.6 nm/sec, which is high, and it was found that there was a risk that the pattern may start to dissolve after the alkali development. It was also found that a coating film of the positive photoresist composition (3) had a low Tg of 107° C. and the heat resistance thereof was insufficient.

The positive photoresist compositions (4)/(4') of Comparative Example 2 are examples that use, as a sensitivity enhancer, the polycondensate (C2) before being turned into the novolac phenol resin (B). The positive photoresist composition (4') not containing a sensitizer and corresponding to exposed portions had a significantly high alkali dissolution rate of 36 nm/sec. However, the alkali dissolution rate of the positive photoresist composition (4) containing a sensitizer and corresponding to unexposed portions was 0.7 nm/sec, which is high, and it was found that there is a risk that the pattern may start to dissolve after alkali development. It was also found that a coating film of the positive photoresist composition (4) had a low Tg of 105° C. and the heat resistance thereof was insufficient.

The positive photoresist compositions (5)/(5') of Comparative Example 3 are examples that use, as a sensitivity enhancer, a novolac phenol resin (H1) different from those used in the present invention. It was found that the positive photoresist composition (5') not containing a sensitizer and corresponding to exposed portions had a slightly low alkali dissolution rate of 19 nm/sec and that the sensitivity was insufficient. It was also found that Tg of the coating film of the positive photoresist composition (5) was as low as 83° C. and the heat resistance was insufficient.

The positive photoresist compositions (6)/(6') of Comparative Example 4 are examples that use THBP commonly used as a sensitivity enhancer. The positive photoresist composition (6') not containing a sensitizer and corresponding to exposed portions had a significantly high alkali dissolution rate of 105 nm/sec. However, the alkali dissolution rate of the positive photoresist composition (6) containing a sensitizer and corresponding to unexposed portions was 0.8 nm/sec, which is high, and it was found that there is a risk that the pattern may start to dissolve after alkali development. It was also found that a coating film of the positive photoresist composition (6) had a low Tg of 102° C. and the heat resistance thereof was insufficient.

The positive photoresist compositions (7)/(7') of Comparative Example 5 are examples that use only cresol novolac resins and no sensitivity enhancer. It was found that the positive photoresist composition (6') not containing a sensitizer and corresponding to exposed portions had a significantly low alkali dissolution rate of 1.5 nm/sec and that the sensitivity was poor. It was also found that the Tg of the coating film of the positive photoresist composition (7) was 117° C., which is slightly low, and the heat resistance was insufficient.

The invention claimed is:

1. A positive photoresist composition comprising 3 to 80 parts by mass of a novolac phenol resin (B) relative to 100 parts by mass of a cresol novolac resin (A), wherein the novolac phenol resin (B) has a repeating structural unit represented by formula (1) below:

[Chem. 1]

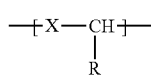

(1)

[In the formula, R represents a hydrogen atom or a hydrocarbon group having 1 to 12 carbon atoms and X represents a structure (x1) represented by formula (2) below:

[Chem. 2]

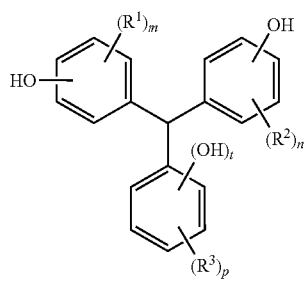

(2)

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)], wherein a content of the structure (x1) relative to the total number of the structure (x1) and the structure (x2) is 85% or more.

2. The positive photoresist composition according to claim 1, wherein the structural unit represented by formula (1) is a structural unit represented by formula (1-1) below:

[Chem. 3]

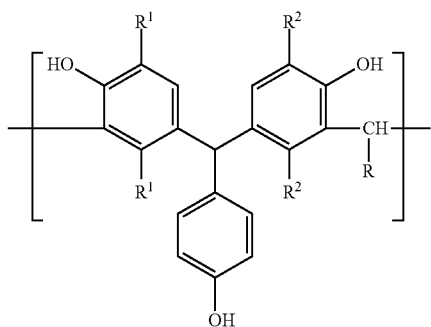

(1-1)

(In the formula, R represents a hydrogen atom or a hydrocarbon group having 1 to 12 carbon atoms and $R^1$ and $R^2$ each independently represent a hydrogen atom or an alkyl group having 1 to 8 carbon atoms).

3. The positive photoresist composition according to claim 2, wherein a weight-average molecular weight of the novolac phenol resin (B) is 5,000 to 35,000.

4. The positive photoresist composition according to claim 3, wherein the novolac phenol resin (B) contains 90% or more of (x1) relative to a total of 100 of (x1) and (x2).

5. A coating film obtained by applying and drying the positive photoresist composition according to claim 3.

6. The positive photoresist composition according to claim 2, wherein the novolac phenol resin (B) is obtained by performing polycondensation of 2,5-xylenol and 4-hydroxybenzaldehyde in the presence of an acid catalyst to obtain a polycondensate represented by formula (2-1) below:

[Chem. 5]

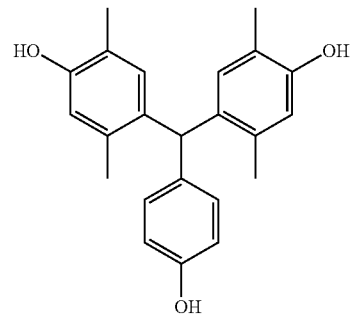

(2-1)

and then allowing the polycondensate to react with an aldehyde compound (D) in the presence of an acid catalyst.

7. The positive photoresist composition according to claim 6, wherein the aldehyde compound (D) is formaldehyde.

8. The positive photoresist composition according to claim 2, wherein the novolac phenol resin (B) contains 90% or more of (x1) relative to a total of 100 of (x1) and (x2).

9. A coating film obtained by applying and drying the positive photoresist composition according to claim 2.

10. The positive photoresist composition according to claim 1, wherein the structural unit represented by formula (1) is a structural unit represented by formula (1-2) below:

[Chem. 4]

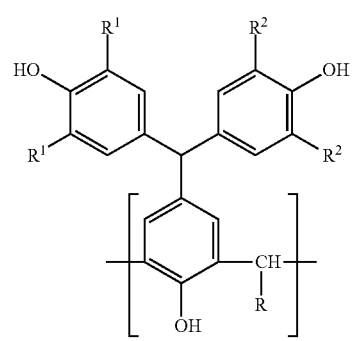

(1-2)

(In the formula, R represents a hydrogen atom or a hydrocarbon group having 1 to 12 carbon atoms and $R^1$ and $R^2$ each independently represent a hydrogen atom or an alkyl group having 1 to 8 carbon atoms).

11. The positive photoresist composition according to claim 10, wherein a weight-average molecular weight of the novolac phenol resin (B) is 1000 to 5000.

12. The positive photoresist composition according to claim 10, wherein the novolac phenol resin (B) is obtained by performing polycondensation of 2,6-xylenol and 4-hydroxybenzaldehyde in the presence of an acid catalyst to obtain a polycondensate represented by formula (2-2) below:

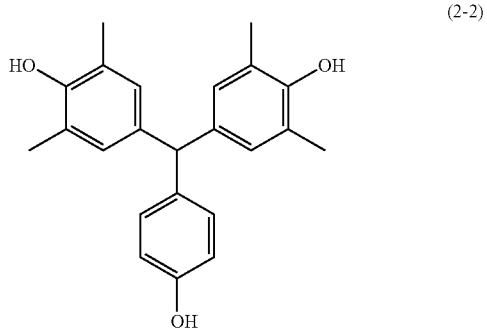 [SMILES: Cc1cc(C(c2ccc(O)cc2)c2cc(C)c(O)c(C)c2)cc(C)c1O]

(2-2)

and then allowing the polycondensate to react with an aldehyde compound (D) in the presence of an acid catalyst.

13. The positive photoresist composition according to claim 12, wherein the aldehyde compound (D) is formaldehyde.

14. The positive photoresist composition according to claim 10, wherein the novolac phenol resin (B) contains 90% or more of (x1) relative to a total of 100 of (x1) and (x2).

15. The positive photoresist composition according to claim 1, wherein the novolac phenol resin (B) contains 90% or more of (x1) relative to a total of 100 of (x1) and (x2).

16. The positive photoresist composition according to claim 1, comprising 20 to 60 parts by mass of the novolac phenol resin (B) relative to 100 parts by mass of the cresol novolac resin (A).

17. The positive photoresist composition according to claim 1, wherein the cresol novolac resin (A) is prepared by using, as essential raw materials, m-cresol or p-cresol, and formaldehyde.

18. A coating film obtained by applying and drying the positive photoresist composition according to claim 1.

19. A novolac phenol resin comprising a repeating structural unit represented by formula (1) below:

[Chem. 7]

(1)

[In the formula, R represents a hydrogen atom or a hydrocarbon group having 1 to 12 carbon atoms and X represents a structure (x1) represented by formula (2) below:

[Chem. 8]

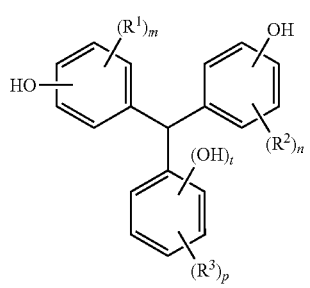

(2)

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)], wherein a content of the structure (x1) relative to the total number of the structure (x1) and the structure (x2) is 85% or more, and the structural unit represented by formula (1) is a structural unit represented by formula (1-1) below:

[Chem. 9]

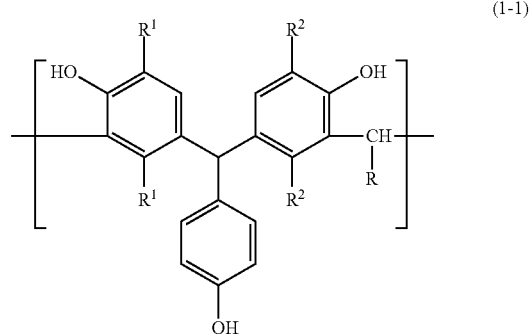

(1-1)

(In the formula, R represents a hydrogen atom or a hydrocarbon group having 1 to 12 carbon atoms and $R^1$ and $R^2$ each independently represent a hydrogen atom or an alkyl group having 1 to 8 carbon atoms).

20. A novolac phenol resin comprising a repeating structural unit represented by formula (1) below:

[Chem. 10]

(1)

[In the formula, R represents a hydrogen atom or a hydrocarbon group having 1 to 12 carbon atoms and X represents a structure (x1) represented by formula (2) below:

[Chem. 11]

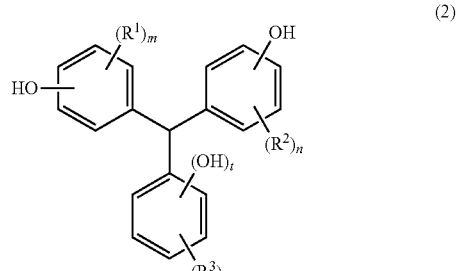

(2)

(In the formula, $R^1$, $R^2$, and $R^3$ each independently represent a hydrogen atom or an alkyl group having 1 to 8 carbon atoms; m and n each independently represent an integer of 1 to 4; p represents an integer of 0 to 4; and t represents 1 or 2) or an aromatic hydrocarbon group (x2) other than the structure (x1)], wherein a content of the structure (x1) relative to the total number of the structure (x1) and the structure (x2) is 85% or more, and the structural unit represented by formula (1) is a structural unit represented by formula (I-2) below:

[Chem. 12]

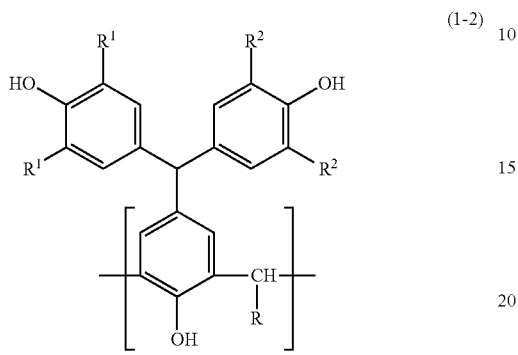

(1-2)

(In the formula, R represents a hydrogen atom or a hydrocarbon group having 1 to 12 carbon atoms and $R^1$ and $R^2$ each independently represent a hydrogen atom or an alkyl group having 1 to 8 carbon atoms).

* * * * *